United States Patent [19]

Natsume et al.

[11] Patent Number: 5,761,113
[45] Date of Patent: Jun. 2, 1998

[54] SOFT ERROR SUPPRESSING RESISTANCE LOAD TYPE SRAM CELL

[75] Inventors: Hidetaka Natsume; Nolifumi Sato; Hitoshi Mitani; Takami Hiruma, all of Tokyo, Japan

[73] Assignee: NEC Corporation, Tokyo, Japan

[21] Appl. No.: 550,348

[22] Filed: Oct. 30, 1995

[30] Foreign Application Priority Data

Oct. 28, 1994 [JP] Japan .................. 6-265870

[51] Int. Cl.$^6$ ............................... G11C 11/00
[52] U.S. Cl. ................ 365/154; 365/51; 365/63; 365/100; 365/148
[58] Field of Search ............................. 365/154, 51, 63, 365/148, 100

[56] References Cited

U.S. PATENT DOCUMENTS 5,452,246  9/1995  Kawashima ................ 365/154

FOREIGN PATENT DOCUMENTS 63-193558  8/1988  Japan .
5-90540    4/1993  Japan .

*Primary Examiner*—Do Hyun Yoo
*Attorney, Agent, or Firm*—Young & Thompson

[57] ABSTRACT

In an SRAM cell including two cross-coupled inverters each having a first resistance element and a drive MOS transistor, a second resistance element is connected between the first and the drive MOS transistor. A gate electrode of the drive MOS transistor of one of the inverters is connected between the first and second resistance elements of the other.

12 Claims, 10 Drawing Sheets

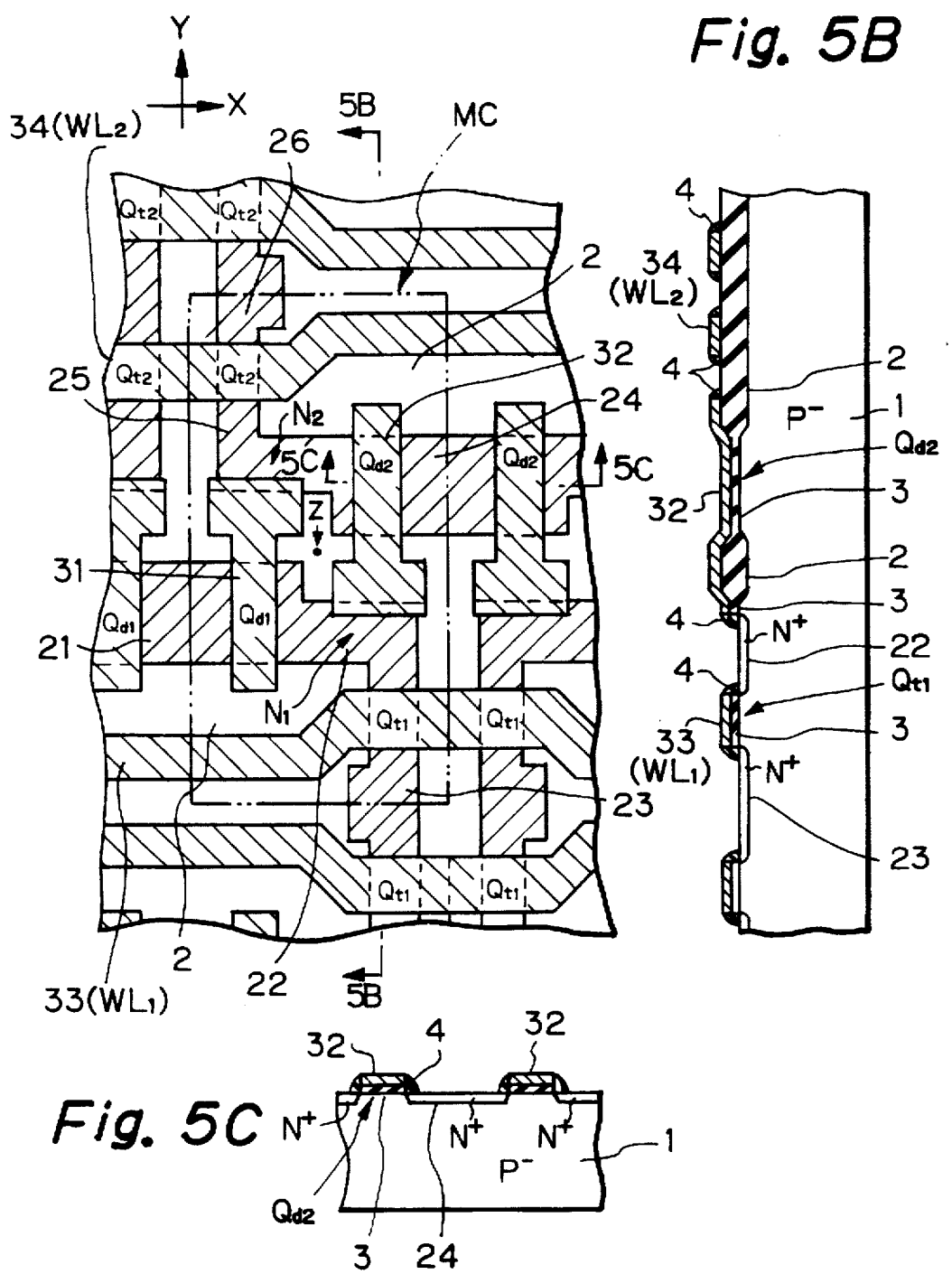

Fig. 6A
Fig. 6B
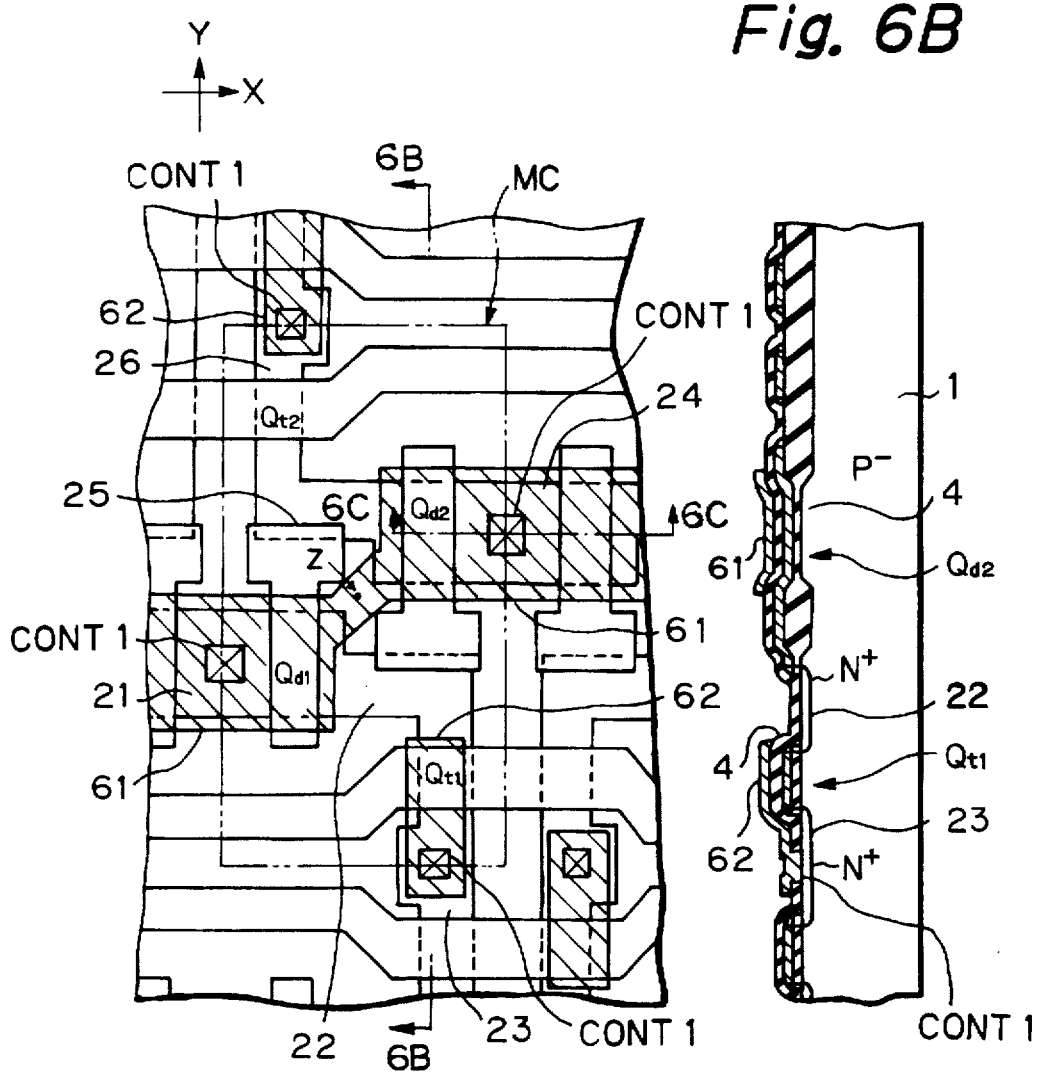
Fig. 6C
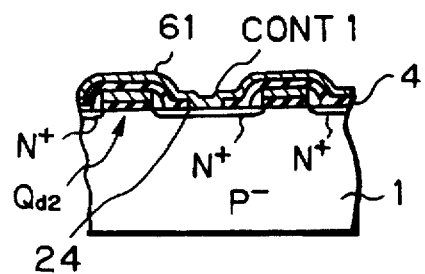

Fig. 8A
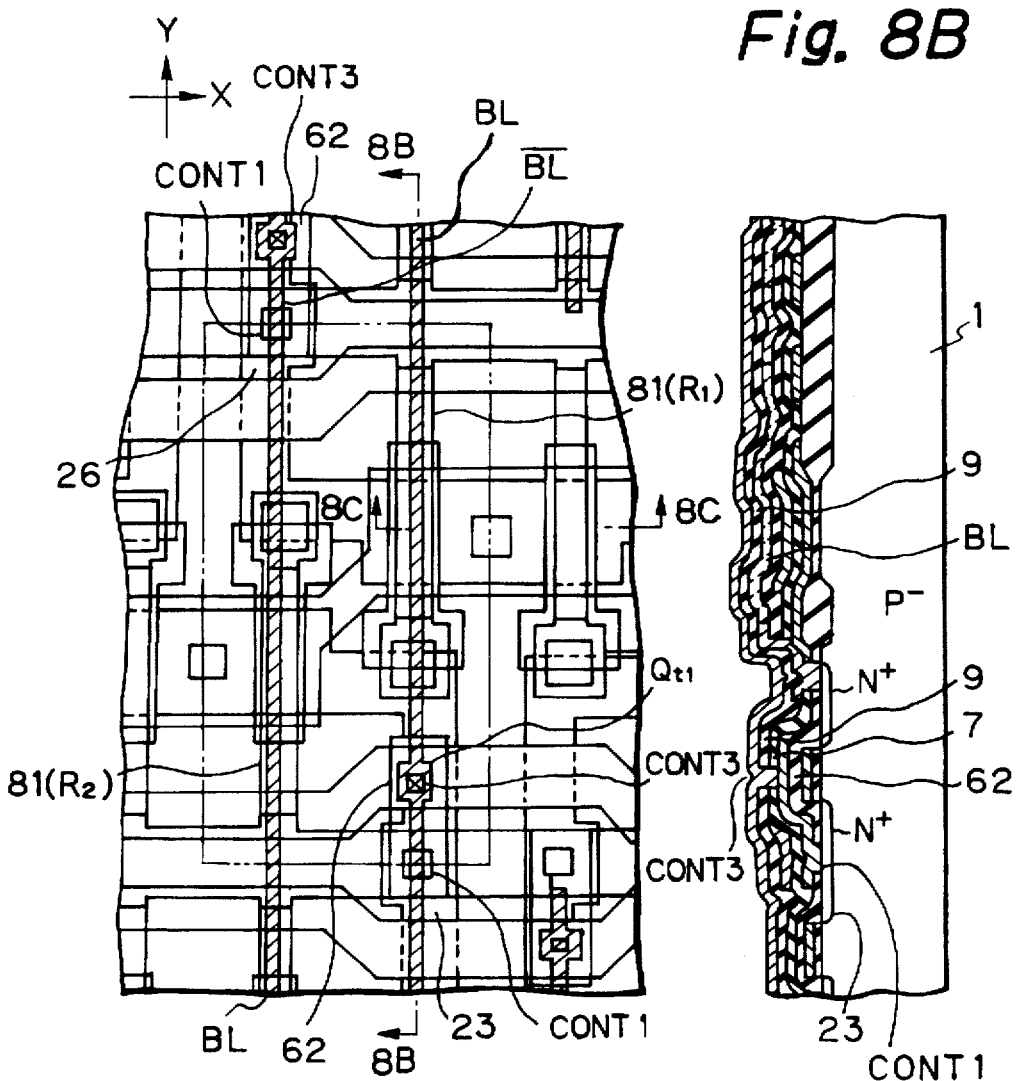
Fig. 8B
Fig. 8C
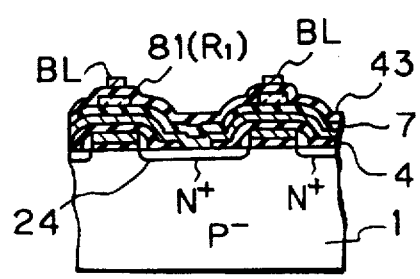

SOFT ERROR SUPPRESSING RESISTANCE LOAD TYPE SRAM CELL

BACKGROUND OF THE INVENTION

1. Field of the Invention

The present invention relates to a metal oxide semiconductor (MOS) device, and more particularly, to a static random access memory (SRAM) device having a resistance load type cell.

2. Description of the Related Art

A prior art SRAM cell is constructed by a flip-flop formed by cross-coupled first and second inverters and transfer gates connected to first and second nodes of the flip-flop. That is, the first inverter is formed by a first resistance element between a high power supply terminal and the first node and a first drive MOS transistor between the first node and a ground terminal. Similarly, the second inverter is formed by a second resistance element between the high power supply terminal and the second node and a second drive MOS transistor between the second node and the ground terminal.

Also, the first node is connected directly to a gate electrode of the second drive transistor, so that the second drive transistor is driven directly by the voltage at the first node. Similarly, the second node is connected directly to a gate electrode of the first drive transistor, so that the first drive transistor is driven directly by the voltage at the second node.

This prior art SRAM cell will be explained later in detail.

The above-decribed prior art SRAM cell, however, is subject to soft errors caused by α rays. That is, the first and second nodes are constructed by impurity diffusion regions in a semiconductor substrate. Therefore,when α rays penetrate into the first and second nodes or their neighborhood, so that the voltages at the first and second nodes fluctuate, the operation states of the first and second drive transistors fluctuate immediately. Thus, the state of the SRAM cell may be reversed.

SUMMARY OF THE INVENTION

It is an object of the present invention to provide a resistance load type SRAM cell capable of suppressing soft errors caused by α rays.

Another object is to reduce the manufacturing cost of a resistance load type symmetrical SRAM device.

According to the present invention, in an SRAM cell including two cross-coupled inverters each having a first resistance element and a drive MOS transistor, a second resistance element is connected between the first resistance element and the drive MOS transistor. A gate electrode of the drive MOS transistor of one of the inverters is connected between the first and second resistance elements of the other inverter. Thus, even when α rays penerate into impurity diffusion regions (or drain regions) of the drive MOS transistor of one of the inverters so as to fluctuate the voltage thereof, the fluctuation of the voltage at the gate electrode of the drive MOS transistor of the other inverter is suppressed by the second resistance element. Thus, soft errors caused by α rays can be suppressed.

Also, the inverters are made symmetrical with respect to their center by providing two word lines thereto. Thus, the gate electrodes of the drive MOS transistors can be formed simultaneously with the word lines, to reduce the manufacturing cost.

BRIEF DESCRIPTION OF THE DRAWINGS

The present invention will be more clearly understood from the description as set forth below, as compared with the prior art, with reference to the accompanying drawings, wherein:

FIGS. 5A, 6A, 7A and 8A are plan views for explaining a method for manufacturing the SRAM cell of FIG. 4;

FIGS. 5B, 6B, 7B and 8B are cross-sectional views taken along the lines 5B, 6B, 7B and 8B of FIGS. 5A, 6A, 7A and 8A, respectively;

FIGS. 5C, 6C, 7C and 8C are cross-sectional views taken along the lines 5C, 6C, 7C and 8C of FIGS. 5A, 6A, 7A and 8A, respectively;

DESCRIPTION OF THE PREFERRED EMBODIMENT

Before the description of the preferred embodiment, a prior art SRAM cell will be explained with reference to FIGS. 1, 2A, 2B, 2C and 3.

Figure 1:
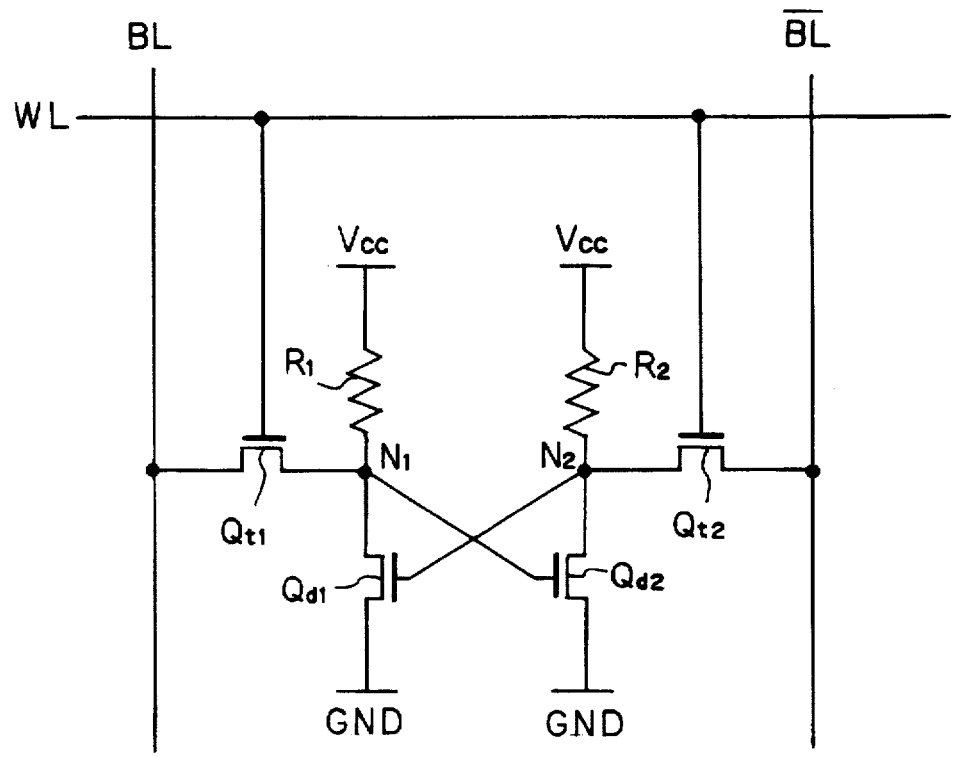
FIG. 1 is an equivalent circuit diagram illustrating a prior art SRAM cell.

In FIG. 1, which is an equivalent circuit diagram illustrating a prior art SRAM cell, one memory cell is provided at each intersection between a word line WL and two complementary bit lines BL and $\overline{BL}$. This memory cell is constructed by a flip-flop formed by two cross-coupled inverters, and two N-channel transfer MOS transistors $Q_{t1}$ and $Q_{t2}$ between nodes $N_1$ and $N_2$ of the flip-flop and the bit lines BL and $\overline{BL}$.

A resistance element $R_1$ and a drive MOS transistor $Q_{d1}$ are connected in series between a power supply terminal $V_{cc}$ and a ground terminal GND to form an inverter. Similarly, a resistance element $R_2$ and a drive MOS transistor $Q_{d2}$ are connected in series between the power supply terminal $V_{cc}$ and the ground terminal GND to form an inverter. Also, the node $N_1$ between the resistance element $R_1$ and the drive transistor $Q_{d1}$ is connected to a gate of the drive transistor $Q_{d2}$, so that the drive transistor $Q_{d2}$ is driven by the voltage at the node $N_1$. Similarly, the node $N_2$ between the resistance element $R_2$ and the drive transistor $Q_{d2}$ is connected to a gate of the drive transistor $Q_{d1}$, so that the drive transistor $Q_{d1}$ is driven by the voltage at the node $N_2$.

When the voltage at the word line WL is made high to turn ON the transfer transistors $Q_{t1}$ and $Q_{t2}$, data is written from the bit lines BL and $\overline{BL}$ into the nodes $N_1$ and $N_2$, or data is read from the nodes $N_1$ and $N_2$ to the bit lines BL and $\overline{BL}$.

A contact structure for the node $N_1$ of FIG. 1 is explained next with reference to FIGS. 2A, 2B and 2C. Note that the node $N_2$ has the same configuration as the node $N_1$.

Figure 2A:
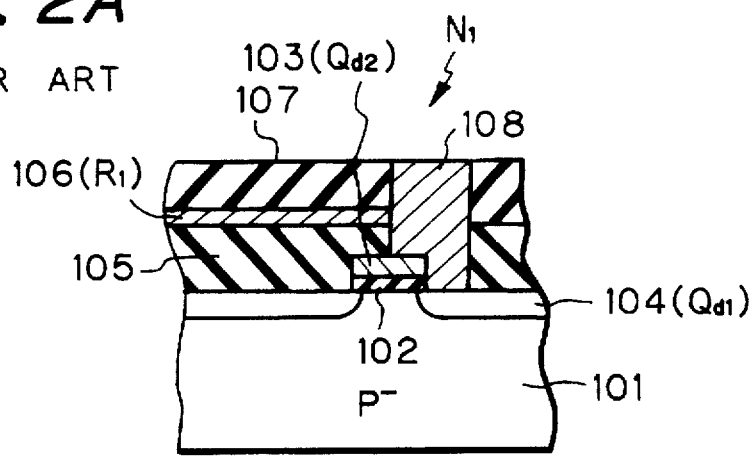
FIGS. 2A, 2B and 2C are cross-sectional views of the contact structures of FIG. 1.

In FIG. 2A (see: JP-A-63-193558), a gate silicon oxide layer 102 and a polycrystalline silicon layer 103 serving as the gate electrode of the drive transistor $Q_{d2}$ is formed on a P-type silicon substrate 101. Also, an $N^+$-type impurity diffusion region 104 serving as the drain region of the drive transistor $Q_{d1}$ is formed within the silicon substrate 101.

Further, an insulating layer 105, a polycrystalline silicon layer 106 serving as the resistance element $R_1$ and an insulating layer 107 are formed in this order. A contact hole is perforated in the insulating layers 105 and 107, and a polycrystalline silicon contact structure 108 is buried in the contact hole. In this case, the polycrystalline silicon layer 106 ($R_1$) has a low concentration of impurities, and therefore, he resistance of the polycrystalline silicon layer 106 ($R_1$) is relatively high, while the polycrystalline silicon contact structure 108 has a high concentration of impurities, and therefore, the resistance of the polycrystalline contact structure 108 is relatively low.

Thus, in FIG. 2A, since the gate electrode of the drive transistor $Q_{d2}$ is connected via the low resistance of the polycrystalline contact structure 108 to the drain region of the drive transistor $Q_{d1}$, the resistance between the gate electrode of the drive transistor $Q_{d2}$ and the drain region of the drive transistor $Q_{d1}$ is substantially zero.

Figure 2B:
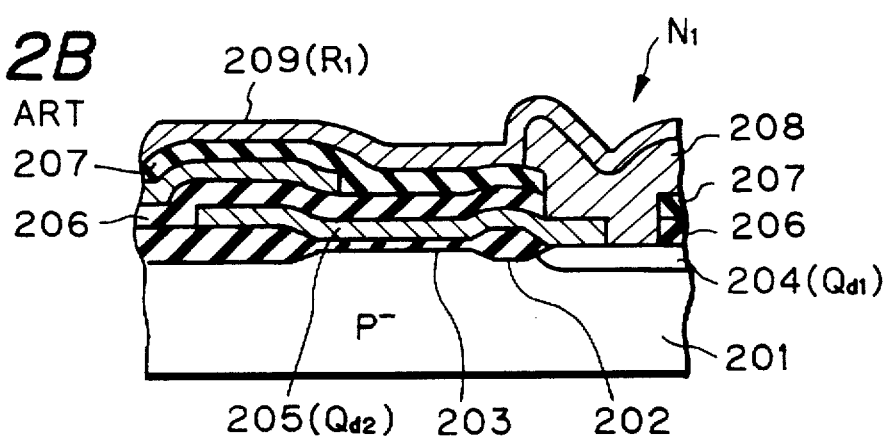

In FIG. 2B (see: JP-A-5-90540), a thick field silicon oxide layer 202 and a gate silicon oxide layer 203 are formed on a p-type silicon substrate 201. Also, an $N^+$-type impurity diffusion region 204 serving as the drain region of the drive transistor $Q_{d1}$ is formed within the silicon substrate 201. Further, a polycrystalline silicon layer 205 serving as the gate electrode of the drive transistor $Q_{d2}$ is formed. Then, insulating layers 206 and 207 are formed. A contact hole is perforated in the insulating layers 206 and 207, and a polycrystalline silicon contact structure 208 is buried in the contact hole. Then, a polycrystalline silicon layer 209 serving as the resistance element $R_1$ is formed. In this case, the polycrystalline silicon layer 209 ($R_1$) has a low concentration of impurities, and therefore, the resistance of the polycrystalline silicon layer 209 ($R_1$) is relatively high, while the polycrystalline silicon contact structure 208 has a high concentration of impurities, and therefore, the resistance of the polycrystalline contact structure 208 is relatively low.

Thus, in FIG. 2B, since the gate electrode of the drive transistor $Q_{d2}$ is connected directly to the drain region of the drive transistor $Q_{d1}$, the resistance between the gate electrode of the drive transistor $Q_{d2}$ and the drain region of the drive transistor $Q_{d1}$ is substantially zero.

Figure 2C:
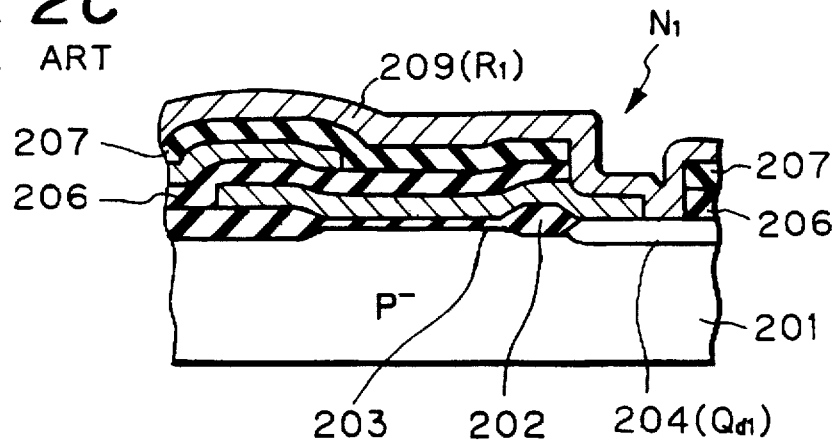

In FIG. 2C (see: JP-A-5-90540), the low resistance polycrystalline silicon layer 208 of FIG. 2B is removed, so that the polycrystalline silicon layer 209 ($R_1$) is also connected directly to the drain region of the drive transistor $Q_{d1}$.

Thus, even in FIG. 2C, since the gate electrode of the drive transistor $Q_{d2}$ is connected directly to the drain region of the drive transistor $Q_{d1}$, the resistance between the gate electrode of the drive transistor $Q_{d2}$ and the drain region of the drive transistor $Q_{d1}$ is substantially zero.

In FIGS. 1, 2A, 2B and 2C, as stated above, however, the SRAM cell is subjected to soft errors caused by $\alpha$ rays. That is, when $\alpha$ rays penetrate into the drain region 104 of the drive transistor $Q_{d1}$ or its neighborhood, the voltage at the drain region of the drive transistor $Q_{d1}$ fluctuates, and immediately thereafter, the voltage at the gate electrode 103 of the drive transistor $Q_{d2}$ also fluctuates. Therefore, the data retention characteristics of the SRAM cell are deteriorated, so that the state of the SRAM cell may be reversed.

Figure 3:
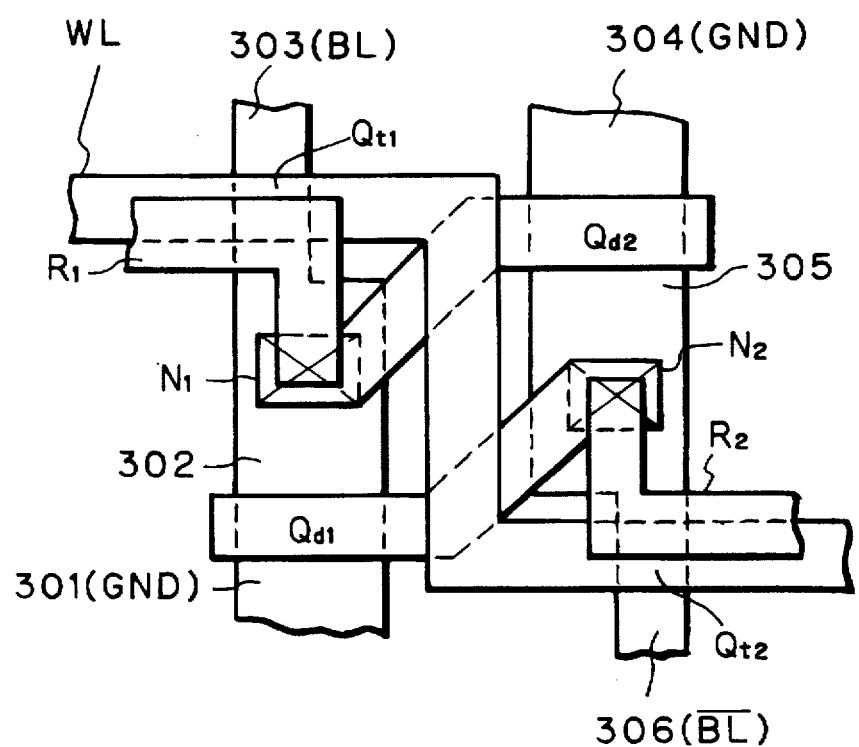
FIG. 3 is a plan view illustrating the SRAM cell of FIG. 1.

In FIG. 3, which is a plan view of the SRAM cell of FIG. 1 (see: JP-A-63-193558), reference numerals 301 through 306 designate $N^+$-type impurity regions. In this case, the regions 301 and 304 are connected to the ground terminal GND, and the regions 303 and 306 are connected to the bit lines BL and $\overline{BL}$, respectively.

The drive transistor $Q_{d1}$ has the region 301 as a source region, the region 302 as a drain region, and a gate electrode made of polycrystalline silicon. Similarly, the drive transistor $Q_{d2}$ has the region 304 as a source region, the region 305 as a drain region, and a gate electrode made of polycrystalline silicon. The drive transistors $Q_{d1}$ and $Q_{d2}$ are symmetrical with respect to a center location as indicated by Z.

The transfer transistor $Q_{t1}$ has the region 302 as a source region, the region 303 as a drain region, and a gate electrode serving as the word line WL made of polycrystalline silicon. Similarly, the transfer transistor $Q_{t2}$ has the region 305 as a source region, the region 306 as a drain region, and a gate electrode serving as the word line WL made of polycrystalline silicon. The transfer transistors $Q_{t1}$ and $Q_{t2}$ are symmetrical with respect to the center location Z.

The resistance element $R_1$ made of polycrystalline silicon is connected at the node $N_1$, to the region 302. Similarly, the resistance element $R_2$ made of polycrystalline silicon is connected at the node $N_2$ to the region 305. The resistance elements $R_1$ and $R_2$ are also symmetrical with respect to the center location Z.

The symmetrical configuration of the SRAM cell as illustrated in FIG. 3 equalizes the operation of the two inverters, which is helpful in improving the data retention characteristics.

In FIG. 3, however, the gate electrodes of the drive transistors $Q_{d1}$ and $Q_{d2}$ are formed by a first polycrystalline silicon layer, the word line WL is formed by a second polycrystalline silicon layer, and the resistance elements $R_1$ and $R_2$ are formed by a third polycrystalline silicon layer. This multiple polycrystalline silicon configuration increases the manufacturing cost.

Figure 4:
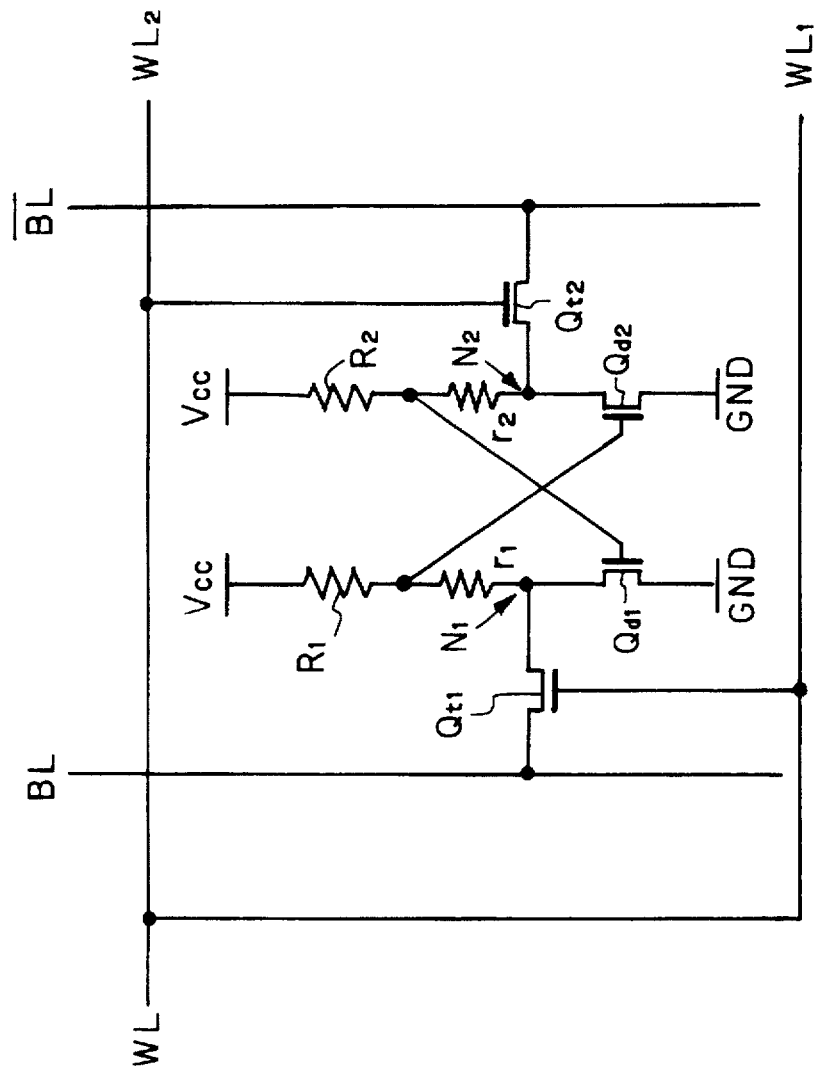
FIG. 4 is an equivalent circuit diagram illustrating an embodiment of the SRAM cell according to the present invention.

In FIG. 4, which is an equivalent circuit diagram illustrating an embodiment of the SRAM cell according to the present invention, a resistance element $r_1$, is inserted between the resistance element $R_1$ and the drain of the drive transistor $Q_{d1}$ of FIG. 1, so that the drain region of the drive transistor $Q_{d1}$ is connected via the resistance element $r_1$ to the gate electrode of the drive transistor $Q_{d2}$. Similarly, a resistance element $r_2$ is inserted between the resistance element $R_2$ and the drain of the drive transistor $Q_{d2}$ of FIG. 1, so that the drain region of the drive transistor $Q_{d2}$ is connected via the resistance element $r_2$ to the gate electrode of the drive transistor $Q_{d1}$. Thus, when the voltage at the node $N_1$ or $N_2$ fluctuate due to the penetration of $\alpha$ rays into the drain region of the drive transistor $Q_{d1}$ or $Q_{d2}$, the fluctuation of the voltages is suppressed, so that the voltages at the gate electrodes of the drive transistors $Q_{d2}$ and $Q_{d1}$ hardly fluctuate, thus improving the data retention characteristics.

Also, in FIG. 4, the word line WL of FIG. 1 is divided into two word lines $WL_1$ and $WL_2$ at a peripheral area of the SRAM cell. Therefore, the same voltage is applied to the word lines $WL_1$ and $WL_2$. This double word line configuration can reduce the number of layers.

The manufacturing steps of the SRAM cell of FIG. 4 is explained next with reference to FIGS. 5A, 5B, 5C, 6A, 6B, 6C, 7A, 7B, 7C, 8A, 8B and 8C. Note that FIGS. 5B, 6B, 7B and 8B are cross-sectional views taken along the lines 5B, 6B, 7B and 8B of FIGS. 5A, 6A, 7A and 8A, respectively, and FIGS. 5C, 6C, 7C and 8C are cross-sectional views taken along the lines 5C, 6C, 7C and 8C of FIGS. 5A, 6A, 7A and 8A, respectively. Also, one SRAM cell is indicated by a solid-dot line MC in FIGS. 5A, 6A, 7A and 8A.

First, referring to FIGS. 5A, 5B and 5C, a thick field silicon oxide layer 2 is formed on a $P^-$-type monocrystalline silicon substrate 1 by a local oxidation of silicon (LOCOS) process, to partition active areas and field areas for isolating the active areas from each other. Then, a gate silicon oxide layer 3 is grown by thermally oxidizing the substrate 1.

Then, a polycide layer is formed. That is, a phosphorus-including polycrystalline silicon layer having a sheet resistance of about 10 to 100/□ is formed, and thereafter, a refractory silicide layer made of MoSi, WSi or TiSi is formed. The silicide layer and the polycrystalline silicon layer form the polycide layer. The polycide layer is patterned, so that gate electrodes 31 and 32 of the drive transistors $Q_{d1}$ and $Q_{d2}$ along an Y direction and gate electrodes 33 and 34 (or the word lines $WL_1$, and $WL_2$) of the transfer transistors $Q_{t1}$ and $Q_{t2}$ along an X direction are formed.

Then, a silicon oxide layer is deposited on the entire surface by a low pressure chemical vaper deposition (LPCVD) process, and is etched by an anisotropic etching process to form sidewall silicon oxide layers 4 on the sidewalls of the gate electrodes of the transistors $Q_{d1}$, $Q_{d2}$, $Q_{t1}$ and $Q_{t2}$.

Then, N-type impurity ions such as phosphorous ions or arsenic ions are implanted into the silicon substrate 1 with a mask of the gate electrodes 31, 32, 33 and 34 of the transistors $Q_{d1}$, $Q_{d2}$, $Q_{t1}$ and $Q_{t2}$, so that about 0.1 to 0.3 μm deep N⁺-type impurity diffusion regions 21 to 26 are formed in the silicon substrate 1. Then, an annealing operation is performed upon the N⁺-type impurity diffusion regions 21 to 26.

As illustrated in Fig. 5A, the gate electrodes 31 and 32 of the drive transistors $Q_{d1}$ and $Q_{d2}$ and their source and drain regions 21, 22, 24 and 25 are symmetrical with respect to a center location as indicated by Z. Also, the gate electrodes 33 and 34 (the word lines $WL_1$ and $WL_2$) of the transfer transistors $Q_{t1}$ and $Q_{t2}$ are symmetrical with respect to the center location Z. Therefore, the memory cell MC is substantially symmetrical with respect to the center location Z. Also, the memory cell MC is symmetrical to its adjacent memory cells.

The drive transistor $Q_{d1}$ has the N⁺-type impurity region 21 as a source region, the N⁺-type region 22 as a drain region, and the gate electrode 31 therebetween. Similarly, the drive transistor $Q_{d2}$ has the N⁺-type impurity region 24 as a source region, the N⁺-type region 25 as a drain region, and the gate electrode 32 therebetween.

The transfer transistor $Q_{t1}$ has the N⁺-type impurity region 23 as a drain region (or a source region), the N⁺-type impurity region 22 as a source region (or a drain region), and the gate electrode 33 serving as the word line $WL_1$. Similarly, the transfer transistor $Q_{t2}$ has the N⁺-type impurity region 26 as a drain region (or a source region), the N⁺-type impurity region 25 as a source region (or a drain region), and the gate electrode 34 serving as the word line $WL_2$.

The N⁺-type impurity region 22 which serves as the drain region of the drive transistor $Q_{d1}$ as well as the source region of the transfer transistor $Q_{t1}$ forms the node $N_1$ of FIG. 4. In this case, the gate electrode 32 of the drive transistor $Q_{d2}$ is electrically isolated from the node $N_1$. Similarly, the N⁺-type impurity region 25 which serves as the drain region of the drive transistor $Q_{d2}$ as well as the source region of the transfer transistor $Q_{t2}$ forms the node $N_2$ of FIG. 4. In this case, the gate electrode 31 of the drive transistor $Q_{d1}$ is electrically isolated from the node $N_2$.

Next, referring to Figs. 6A, 6B and 6C, an insulating layer 4 is formed, and contact holes CONT1 are formed in the insulating layer 4 on the N⁺-type impurity regions 21, 23, 24 and 26.

Then, a refractory silicide layer and/or a phosphorus-doped polycrystalline silicon layer is formed, and is patterned to form a ground connection layer 61 along the X direction and bit line connection layers 62 along the Y direction.

The ground connection layer 61 is connected via the contact holes CONT1 to the source regions of the drive transistors $Q_{d1}$ and $Q_{d2}$. As a result, the source regions of the drive transistors $Q_{d1}$ and $Q_{d2}$ can be grounded.

On the other hand, the bit connection layer 62, which is shaped as an island, is connected via the contact hole CONT1 to the N⁺-type impurity diffusion region 23 or 26.

As illustrated in FIG. 6A, the bit line connection layer 62 is symmetrical with respect to the center location Z.

Figure 7A:
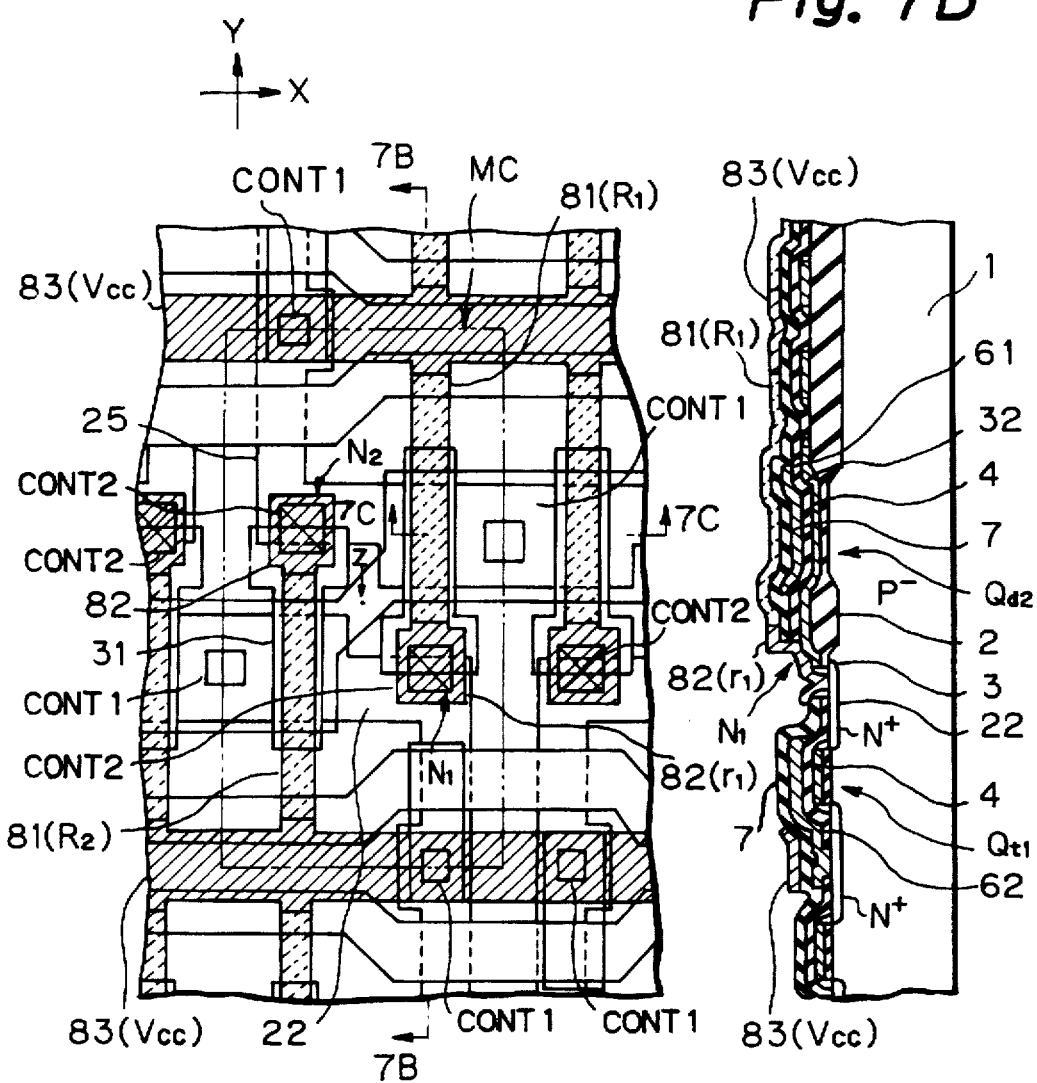
Figure 7B:
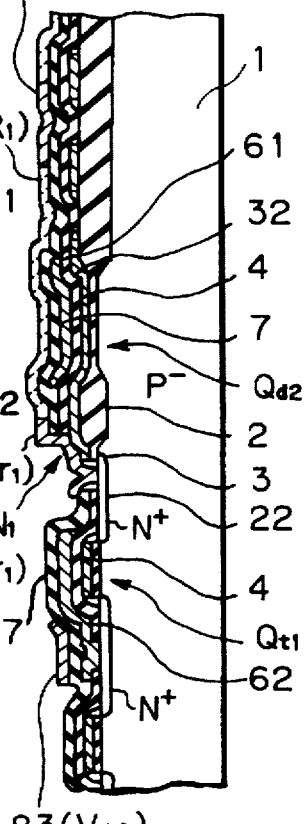
Figure 7C:
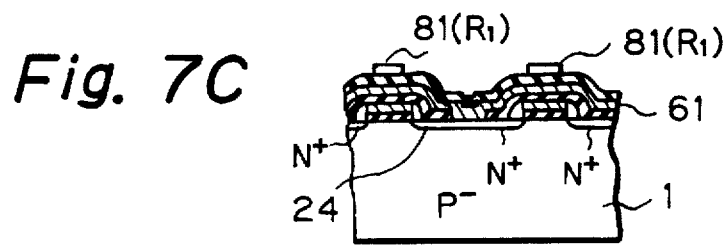

Next, referring to FIGS. 7A, 7B and 7C, an insulating layer 7 made of silicon oxide or a double layer of silicon oxide/phospho-silicated glass (PSG) is formed. Then, contact holes CONT2 are perforated in the insulating layers 7 and 4. The contact holes CONT2 reach the N⁺-type impurity regions 22 and 25 at the nodes $N_1$ and $N_2$.

Then, a silicon layer made of polycrystalline silicon, monocrystalline silicon or amorphous silicon is formed on the entire surface. Then, the silicon layer is patterned, so that resistance layers 81 serving as the resistance elements $R_1$ and $R_2$, along the Y direction resistance layers 82 serving as the resistance elements $r_1$ and $r_2$, and resistance layers 83 along the X direction over the power supply connection layers 62 are formed. In this case, first, N-type impurity ions are implanted into the resistance layers 83 with a mask (not shown) covering the resistance layers 81 and 82, and further, N-type impurity ions are implanted into the resistance layers 83 and 82 with a mask (not shown) covering the resistance layers 81. Then, an annealing operation is performed thereupon. As a result, the sheet resistance of the resistance layers 83 is smaller than that of the resistance layers 82, and the sheet resistance of the resistance layers 82 is smaller than that of the resistance layers 81. For example, if the silicon layer is made of polycrystalline silicon, the sheet resistance of the resistance layers 81 is about 1 GΩ/□ to 100 TΩ/□, and accordingly, the resistance value of each of the resistance elements $R_1$ and $R_2$ is about 5 GΩ to 500 TΩ. Also, the sheet resistance of the resistance layers 82 is about 500 Ω/□ to 5MΩ/□, and accordingly, the resistance value of each of the resistance elements $r_1$ and $r_2$ is about 5 kΩ to 50MΩ.

Here, assume that the occurrence rate of soft errors caused by α rays is 1 when the resistance value of each of the resistance elements $r_1$ and $r_2$ is smaller than 1 kΩ. Then, if the resistance value of each of the resistance elements $r_1$ and $r_2$ is some kΩ to some hundreds of kΩ, the occurrence rate of soft errors is about 0.7. Also, if the resistance value of each of the resistance elements $r_1$ and $r_2$ is some MΩ to some dozens of MΩ, the occurrence rate of soft errors is about 0.2. However, if the resistance values of the resistance elements $r_1$ and $r_2$ are too large, access time is increased. Therefore, the resistance values of the resistance elements $r_1$ and $r_2$ are determined in view of the occurrence rate of soft errors and the access time.

Note that, although the resistance layers 83 cross the bit line connection layers 62, the resistance layers 83 are not electrically connected to the bit line connection layers 62 due to the presence of the insulating layer 7. The resistance layers 83 are connected to a power supply terminal $V_{cc}$.

As illustrated in FIG. 7B, the drain region 22 of the drive transistor $Q_{d1}$ is not connected directly to the gate electrode 32 of the drive transistor $Q_{d2}$. That is, the drain region 22 of the drive transistor $Q_{d1}$ is connected electrically to the gate electrode 32 of the drive transistor $Q_{d2}$ via the resistance layer 82 covering the sidewall silicon oxide layer 4 on the side wall of the gate electrode 32 of the drive transistor $Q_{d2}$.

Similarly, the drain region 25 of the drive transistor $Q_{d2}$ is not connected directly to the gate electrode 31 of the drive transistor $Q_{d1}$. That is, the drain region 25 of the drive transistor $Q_{d2}$ is connected electrically to the gate electrode 31 of the drive transistor $Q_{d1}$ via the resistance layer 82 covering the sidewall silicon oxide layer 4 on the side wall of the gate electrode 31 of the drive transistor $Q_{d1}$.

As illustrated in FIG. 7A, the resistance layers 81, 82 and 83 are symmetrical with respect to the center Z.

Finally, referring to FIGS. 8A, 8B and 8C, a silicon oxide layer 9 is formed by using a CVD process, and contact holes CONT3 are perforated in the silicon oxide layer 9. The contact holes CONT3 reach the bit line connection layers 62.

Then, an aluminum layer is deposited by using a sputtering process, and is patterned to form bit lines BL and $\overline{BL}$ along the Y direction. The bit line BL is connected via the contact hole CONT3 and the bit line connection layer 62 to the N$^+$-type impurity diffusion region 23, i.e., the drain region of the transfer transistor $Q_{t1}$. Similarly, the bit line $\overline{BL}$ is connected via the contact hole CONT3 and the bit line connection layer 62 to the N$^+$-type impurity diffusion region 26, i.e., the drain region of the transfer $Q_{t2}$. Note that the bit line connection layer 62 for the bit line BL is located opposite to the bit line connection 62 for the bit line $\overline{BL}$, and therefore, the bit line connection layers 62 can be relatively wide in the X direction. Also, the wide portions of the bit lines BL and $\overline{BL}$ at the contact holes CONT3 are distant from each other.

Figure 9:
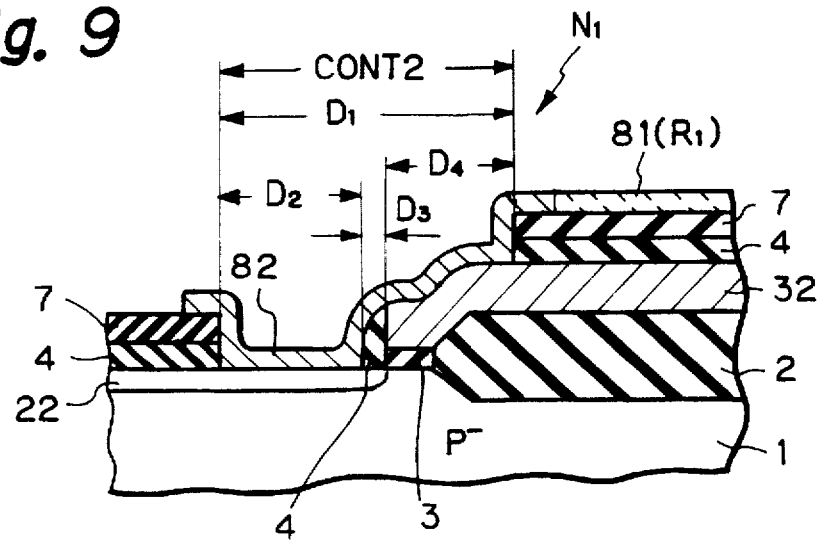
FIG. 9 is an enlarged cross-sectional view of the contact structure of FIG. 7B.

In FIG. 9, which illustrates the node $N_1$ of FIG. 7B in detail, a distance $D_1$ is about 0.6 μm, a distance $D_2$ is about 0.2 μm, a distance $D_3$ is about 0.3 μm, and a distance $D_4$ is about 0.3 μm. In this case, the resistance $r_1$ is substantially determined by the resistance layer 82 indicated by the distance $D_3$.

Figure 10A:
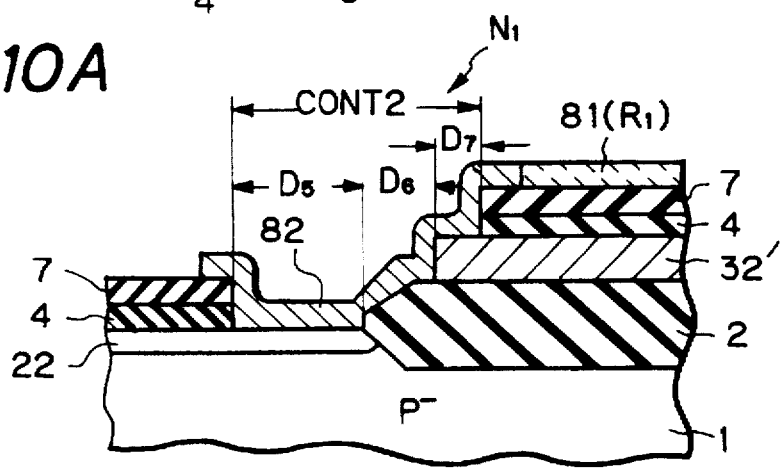
FIGS. 10A and 10B are cross-sectional views illustrating modifications of the contact structure of FIG. 9.

In Fig. 10A, which is a first modification of the node $N_1$ of FIG. 9, a gate electrode 32' of the drive transistor $Q_{d2}$ is terminated on the field silicon oxide layer 2, and therefore, the resistance layer 82 (the resistance element $r_2$) extends also over the field silicon oxide layer 2. For example, a distance $D_5$ is about 0.2 μm, a distance $D_6$ is about 0.2 μm, and a distance $D_7$ is about 0.2 μm. In this case, the resistance value of the resistance $r_1$ is substantially determined the resistance layer 82 indicated by the distance $D_6$.

Figure 10B:
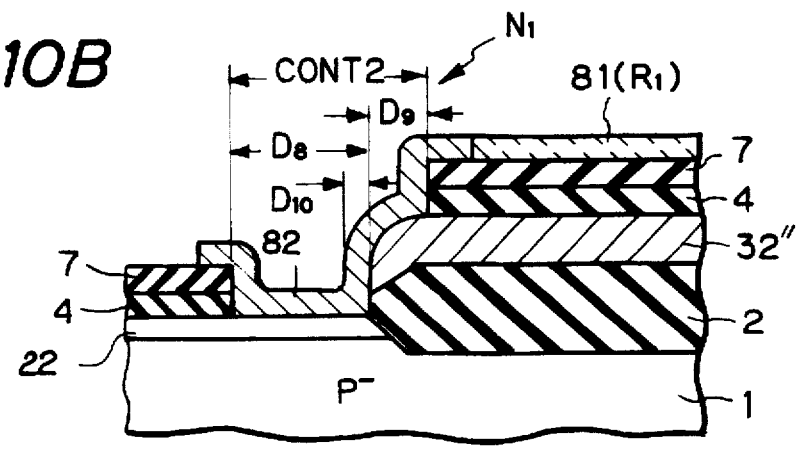

In FIG. 10B, which is a second modification of the node $N_1$ of FIG. 9, a gate electrode 32" of the drive transistor $Q_{d2}$ is terminated at the edge of the field silicon oxide layer 2, and therefore, the resistance layer 82 (the resistance element $r_1$) is in contact with the gate electrode 32" of the drive transistor $Q_{d2}$ at the edge of the field silicon oxide layer 2. For example, a distance $D_8$ is about 0.4 μm, a distance $D_9$ is about 0.2 μm, and a distance $D_{10}$ is about 0.1 μm. Note that the distance $D_{10}$ is a thickness of the resistance layer 82. In this case, the resistance value of the resistance element $r_1$ is substantially determined the resistance layer 82 indicated by the distance $D_{10}$. Although the distance $D_{10}$ is small, ions are hardly implanted into the resistance element 82 indicated by $D_{10}$, so that the resistance value of the resistance element $r_1$ can be made relatively large.

Since $D_6 > D_3 > D_{10}$, the structure of the node $N_1$ as illustrated in FIGS. 9, 10A and 10B has the largest resistance value of the resistance layer 82. However, the structure of the node $N_1$ is selected from those as illustrated in FIG. 9, 10A and 10B in accordance with the allowable limit of the occurrence rate of soft errors and an access time as well as the amount of ions implanted into the resistance layer 82.

Figure 11:
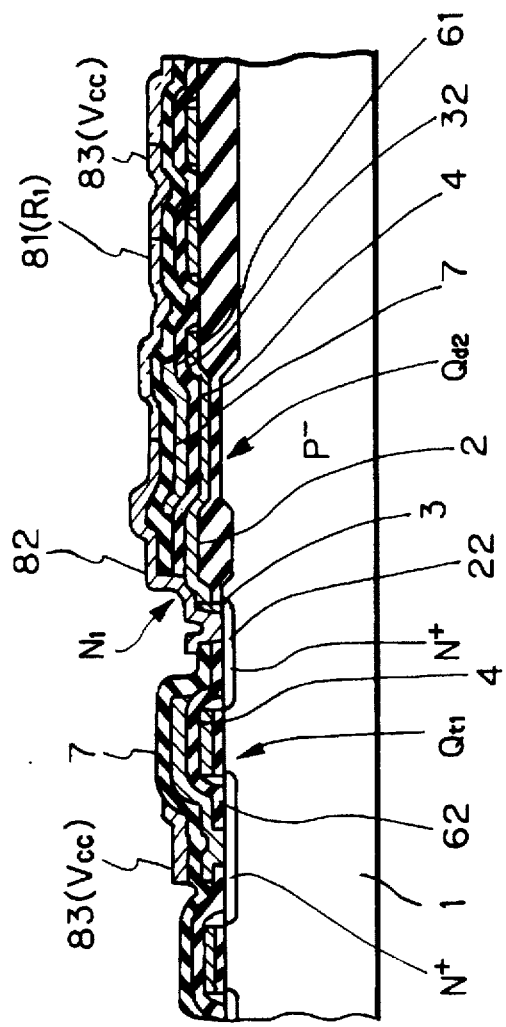
FIG. 11 is a cross-sectional view of a modification of the SRAM cell of FIG. 7B.

In Fig. 11, which is a modification of the SRAM cell of FIG. 7B, the resistance layer 82 extends over the ground connection layer 61, to increase a time constant formed by a resistance between the resistance element $r_1$ and the node $N_1$ (i.e., the drain region 22 of the drive region) and a MOS capacitance formed by the resistance layer 82 and the ground connection layer 61 and the insulating layer 7 therebetween. That is, the capacitance of the node $N_1$, is increased. As a result, even if α rays penetrate into the node $N_1$, the voltage at the node $N_1$ is hardly affected by the α rays, thus improving the data retention characteristics.

As explained hereinbefore, according to the present invention, since a resistance element is inserted between a drain region of one drive transistor and a gate electrode of the other drive transistor, even when the voltage at the drain region of the same one drive transistor is fluctuated by α rays, an induced fluctuation of the voltage at the gate electrode of the other drive transistor is suppressed by the inserted resistance element. Thus, soft errors can be suppressed to thereby maintain good data retention characteristics.

We claim:

1. A static semiconductor memory device comprising:
    first and second power supply terminals;
    first and second resistance elements connected to said first power supply terminal;
    a first drive MOS transistor having a gate electrode connected to said second resistance element, a source connected to said second power supply terminal, and a drain;
    a second drive MOS transistor having a gate electrode connected to said first resistance element, a source connected to said second power supply terminal, and a drain;
    said first resistance element and the drain of said first drive MOS transistor connected through a third resistance element; and
    said second resistance element and the drain of said second drive MOS transistor connected through a fourth resistance element, wherein said third and fourth resistance elements are comprised of resistors.

2. A device as set forth in claim 1, wherein said third and second resistance elements comprise first and second silicon layers, respectively.

3. A device as set forth in claim 2, further comprising:
    a semiconductor substrate of a first conductivity type;
    impurity diffusion regions of a second conductivity type opposite to said first conductivity type, formed in said semiconductor substrate, said impurity diffusion regions serving as the sources and drains of said first and second drive MOS transistors;
    a field insulating layer formed on said semiconductor substrate;
    a gate insulating layer formed on said semiconductor substrate and connected to said field insulating layer, the gate electrodes of said first and second drive MOS transistors being formed on said field insulating layer and said gate insulating layer;
    first and second sidewall insulating layers formed on sidewalls of the gate electrodes of said first and second drive MOS transistors, respectively, said sidewalls being located on said gate insulating layer,
    said first silicon layer being formed on the drain of said first drive MOS transistor, said second sidewall insulating layer and an upper portion of the gate electrode of said second drive MOS transistor adjacent to said second sidewall insulating layer, said second silicon layer being formed on the drain of said second drive MOS transistor, said first sidewall insulating layer and an upper portion of the gate electrode of said first drive MOS transistor adjacent to said first sidewall insulating layer.

4. A device as set forth in claim 2, further comprising:

a semiconductor substrate of a first conductivity type;

impurity diffusion regions of a second conductivity type opposite to said first conductivity type, formed in said semiconductor substrate, said impurity diffusion regions serving as the sources and drains of said first and second drive MOS transistors; and a field insulating layer formed on said semiconductor substrate, the gate electrodes of said first and second drive MOS transistors being formed on said field insulating layer, said first silicon layer being formed on the drain of said first drive MOS transistor, said field insulating layer and sidewall and upper portions of the gate electrode of said second drive MOS transistor, said second silicon layer being formed on the drain of said second drive MOS transistor, said field insulating layer and sidewall and upper portions of the gate electrode of said first drive MOS transistor.

5. A device as set forth in claim 2, further comprising:

a semiconductor substrate of a first conductivity type;

impurity diffusion regions of a second conductivity type opposite to said first conductivity type, formed in said semiconductor substrate, said impurity diffusion regions serving as the sources and drains of said first and second drive MOS transistors; and a field insulating layer formed on said semiconductor substrate, the gate electrodes of said first and second drive MOS transistors being formed on said field insulating layer, sidewalls of the gate electrodes of said first and second drive MOS transistors being approximately located at edges of said field insulating layer, said first silicon layer being formed on the drain of said first drive MOS transistor and sidewall and upper portions of the gate electrode of said second drive MOS transistor, said second silicon layer being formed on the drain of said second drive MOS transistor, and sidewall and upper portions of the gate electrode of said first drive MOS transistor.

6. A device as set forth in claim 1, wherein said first and second resistance elements, said first and second drive MOS transistors, and said third and fourth resistance elements are symmetrical with respect to a center location of a SRAM cell.

7. A static semiconductor memory device including: first and second power supply lines; first and second nodes; a first resistance element connected between said first power supply line and said first node; a second resistance element connected between said first power supply line and said second node; a first drive MOS transistor connected between said first node and said second power supply line and being controlled by a voltage at said second node; a second drive MOS transistor connected between said second node and said second power supply line and being controlled by a voltage at said first node; a first transfer MOS transistor connected between a first bit line and said first node and being controlled by a voltage at a first word line; and a second transfer MOS transistor connected between a second bit line and said second node and being controlled by a voltage at a second word line connected to said first word line, said device comprising:

a first resistance layer, being connected between said first power supply line and said first node, and being divided into a first portion connected to said first power supply line, a second portion serving as said first resistance element, and a third portions, said first node and a gate electrode of said second drive MOS transistor connected through said third portion; and a second resistance layer, being connected between said first power supply line and said second node, and being divided into a first portion connected to said first power supply line, a second portion serving as said second resistance element, and a third portions, said second node and a gate electrode of said first drive MOS transistor connected through said third portion.

8. A device as set forth in claim 7, wherein sheet resistance values of said third portions of said first and second resistance layers are smaller than sheet resistance values of said second portions thereof.

9. A device as set forth in claim 7, wherein sheet resistance values of said first portions of said first and second resistance layers are smaller than sheet resistance values of said third portions thereof.

10. A device as set forth in claim 7, further comprising:

a conductive layer serving as said second power supply line; and an insulating layer formed on said conductive layer, said third portions of said first and second resistance layers overlying said conductive layer via said insulating layer.

11. A device as set forth in claim 7, wherein said first and second resistance layers are symmetrical with respect to a center location thereof.

12. A device as set forth in claim 7, further comprising:

first and second conductive layers serving as the gate electrodes of said first and second drive MOS transistors, respectively;

a third conductive layer serving as a gate electrode of said first transfer MOS transistor and said first word line; and a fourth conductive layer serving as a gate electrode of said second transfer MOS transistor and said second word line, said first second, third and fourth conductive layers being formed simultaneously, said first and second conductive layers being symmetrical with respect to a center location thereof, said third and fourth conductive layers being symmetrical with respect to a center location thereof.

* * * * *